United States Patent [19]
Wieczorek et al.

[11] Patent Number: 6,075,247
[45] Date of Patent: Jun. 13, 2000

[54] DEVICE FOR READING AN IMAGING SENSOR MATRIX

[75] Inventors: Herfried K. Wieczorek, Aachen, Germany; Norbert Conrads, Raeren, Belgium; Ulrich Schiebel, Aachen, Germany

[73] Assignee: U.S. Philips Corporation, New York, N.Y.

[21] Appl. No.: 09/003,039

[22] Filed: Jan. 5, 1998

[30] Foreign Application Priority Data

Jan. 6, 1997 [EP] European Pat. Off. ............. 97200018

[51] Int. Cl.⁷ .......................... G01T 1/24; H01L 27/146
[52] U.S. Cl. ................................. 250/370.09; 250/370.08
[58] Field of Search ........................ 250/370.08, 370.09

[56] References Cited

U.S. PATENT DOCUMENTS

| | | | |
|---|---|---|---|
| 4,945,242 | 7/1990 | Berger et al. | 250/367 |
| 5,120,964 | 6/1992 | Wieczorek | 250/370.08 |
| 5,721,422 | 2/1998 | Bird | 250/208.1 |

*Primary Examiner*—Constantine Hannaher
*Attorney, Agent, or Firm*—Dwight H. Renfrew, Jr.

[57] ABSTRACT

A medical X-ray apparatus is provided with image detector elements 30 which are arranged in a matrix of rows and columns. In order to improve the noise behaviour of the read amplifiers 46 during the reading per row, a plurality of column conductors 36 is provided per column so that the read time is prolonged in proportion to the number of column conductors and the stray capacitance is reduced proportionally. Both steps reduce the noise in known manner. In the case of an integrated implementation, the conductors for driving the reading per row cannot be arranged arbitrarily close to one another because of their mutual capacitance, so that these conductors require a comparatively large surface area. In order to make a smaller surface area suffice for these conductors, according to the invention each read driver 42 is connected to at least two rows of image detector elements 30 which are not associated with the same column conductor, the number of rows thus connected to one read driver being at the most equal to the number of groups of image detector elements in one column.

6 Claims, 3 Drawing Sheets

DEVICE FOR READING AN IMAGING SENSOR MATRIX

BACKGROUND OF THE INVENTION

1. Field of the Invention

The invention relates to an apparatus for forming an image by means of radiation, including a radiation detector unit for picking up the image, which radiation detector unit includes image detector elements which are arranged in a matrix of rows and columns and each of which includes an image sensor element, being sensitive to the imaging radiation, and a controllable switching element which is connected thereto, each column being subdivided into a number of groups of image detector elements, a read conductor being provided for each group of image detectors, which read conductor is connectable, via the associated controllable switching element, to one image sensor element of the group of image sensor elements associated with the relevant column, read drivers for driving the switching elements so as to read an electric variable from the image detector elements, the output of each read driver being connected to an associated control conductor which is connected to a respective control electrode of a controllable switching element of a row of image detector elements.

2. Description of Related Art

A device for reading an imaging sensor matrix is known from U.S. Pat. No. 5,120,964. The known device can be used in an apparatus for forming an image by means of radiation, for example a medical X-ray tomography apparatus.

Generally speaking, apparatus for forming an image by means of radiation, such as an X-ray image for medical purposes, are provided with a radiation detector unit for picking up the image. This unit may be constructed as a matrix of radiation-sensitive elements, i.e. the image detector elements. Each of these image detector elements consists of an image sensor element which is sensitive to the imaging radiation and of a controllable switching element (the switch) which is connected thereto. Upon exposure to the imaging radiation, an electric charge proportional to the radiation dose, i.e. to the intensity of the radiation, is stored in the image sensor element. The image is then obtained by reading the individual image sensor elements; this is performed by connecting the sensor element, via the associated switching element, to a read amplifier which then outputs an electric voltage which is a measure of the radiation intensity of the relevant sensor element. The total set of voltages then represents the desired image in the form of voltage values.

For the reading of the matrix it is generally known to drive each time a complete row of image detector elements and to apply the charge thus read to a column conductor which is associated with a respective column of such elements and acts as a read conductor, said column conductor being connected to an associated read amplifier. In devices of this kind, however, a problem is encountered in that stray capacitances have an adverse effect on reading. Even when all switches are in the non-conductive state (with the exception of that whose sensor element is being read), they still have a stray capacitance, like the read conductor (the column conductor) itself. Consequently, noise occurs in the read signal and the reading operation requires a comparatively long period of time. This is particularly disadvantageous in the case of X-ray equipment in which images are formed in rapid succession, for example 60 images per second.

In order to mitigate this problem, according to the cited US Patent Specification each column is subdivided into a number of groups of image detector elements, a respective column conductor which acts as a read conductor being added to each group of image detectors. This column conductor is connected to a respective one of the group of image detector elements associated with the relevant column. Thus, a plurality of column conductors are provided for each group of image detector elements. During a read operation the switches of the sensor elements of one row are then switched to the conductive state via a control line (a row conductor) associated with the relevant row. The control lines are driven by read drivers which thus serve to drive the switching elements so as to read the charge from the sensor element. The output of each read driver is thus connected to an associated row conductor, the row conductor being connected to the control electrodes of the switches of a row of image detector elements. The sensor elements in the relevant row are thus connected to the associated column conductor which, therefore, is intended exclusively for the group which includes the sensor element activated at that instant. The column conductors associated with one column themselves are connected to a common collecting conductor via further electronic switches. The noise behavior is thus enhanced because each column conductor acting as a read conductor is now connected to a comparatively small part of the switches of the sensor elements of a column. The collecting conductor is also connected to a comparatively small number of switches, because only as many switches as there are column conductors per column are then required. The enhancement of the noise behavior of such a device is greater as one column contains more sensor elements. Because the number of sensor elements in one column may be of the order of one thousand in practical devices, the noise is substantially reduced in such cases.

The known device with a plurality of column conductors per column has a further advantage in that the read time for the individual rows of the matrix can be prolonged in proportion to the number of column conductors, so that the noise in the image is further reduced.

It is a drawback of this known device, however, that as the number of image detector elements per column is increased, and hence also the number of column conductors, the column conductors occupy an increasing amount of space. This is mainly due to the fact that these conductors cannot be arranged arbitrarily close to one another because of the stray capacitance then occurring between these conductors, so that the noise in the read amplifiers would become excessive again.

SUMMARY OF THE INVENTION

It is an object of the invention to provide an apparatus of the kind set forth in which the conductors in the matrix of image detector elements require less space than in the known matrix construction.

To this end, the apparatus according to the invention is characterized in that each read driver is connected to at least two rows of image detector elements which are not associated with the same column conductor, the number of rows thus connected to one read driver being at the most equal to the number of groups of image detector elements in one column. It should be understood that for the purpose of the present invention, the terms "row" and "column" are merely designations of mutually orthogonal directions in the matrix of image detector element and do not necessarily imply any particular orientation in space.

The invention is based on the recognition of the fact that a row conductor (also referred to herein as a row-control conductor) acting as a control line (so actually the read driver) can simultaneously serve more than one row of image detector elements, i.e. at the most as many rows as there are column conductors (also referred to herein as column-read conductors) per column. Moreover, the number of read drivers is thus reduced proportionally. Because in such a radiation detector unit the speed of reading can be substantially higher than in a conventional detector unit, the apparatus according to the invention is particularly suitable for reading at high frame speeds as is necessary, for example in the case of fluoroscopy or in two-dimensional detectors for computer tomography or radiotherapy.

In an embodiment of the invention the read drivers are connected to at least two rows of image detector elements by connecting only one control conductor to each read driver, said control conductor being connected to said at least two rows of image detector elements. Optimum use is then made of the space available on the detector surface. One control conductor now extends between two rows of image detector elements and at the area of each detector element it is provided with short branches extending to either side.

In a preferred embodiment of the invention, the number of rows of image detector elements connected to one read driver amounts to two. It then suffices to use extremely short branches from the control conductor to the image detector elements because these branches need only bridge the distance from the control conductor to the two adjacent rows of detector elements.

BRIEF DESCRIPTION OF THE DRAWINGS

The invention will be described in detail hereinafter with reference to the accompanying Figures of the drawing in which corresponding elements are denoted by corresponding reference numerals. Therein:

FIG. 3b shows diagrammatically a two-dimensional array of image detector elements according to the invention as a substitute for the segment of circle array shown in FIG. 3a.

DETAILED DESCRIPTION OF THE PREFERRED EMBODIMENTS

Figure 1:
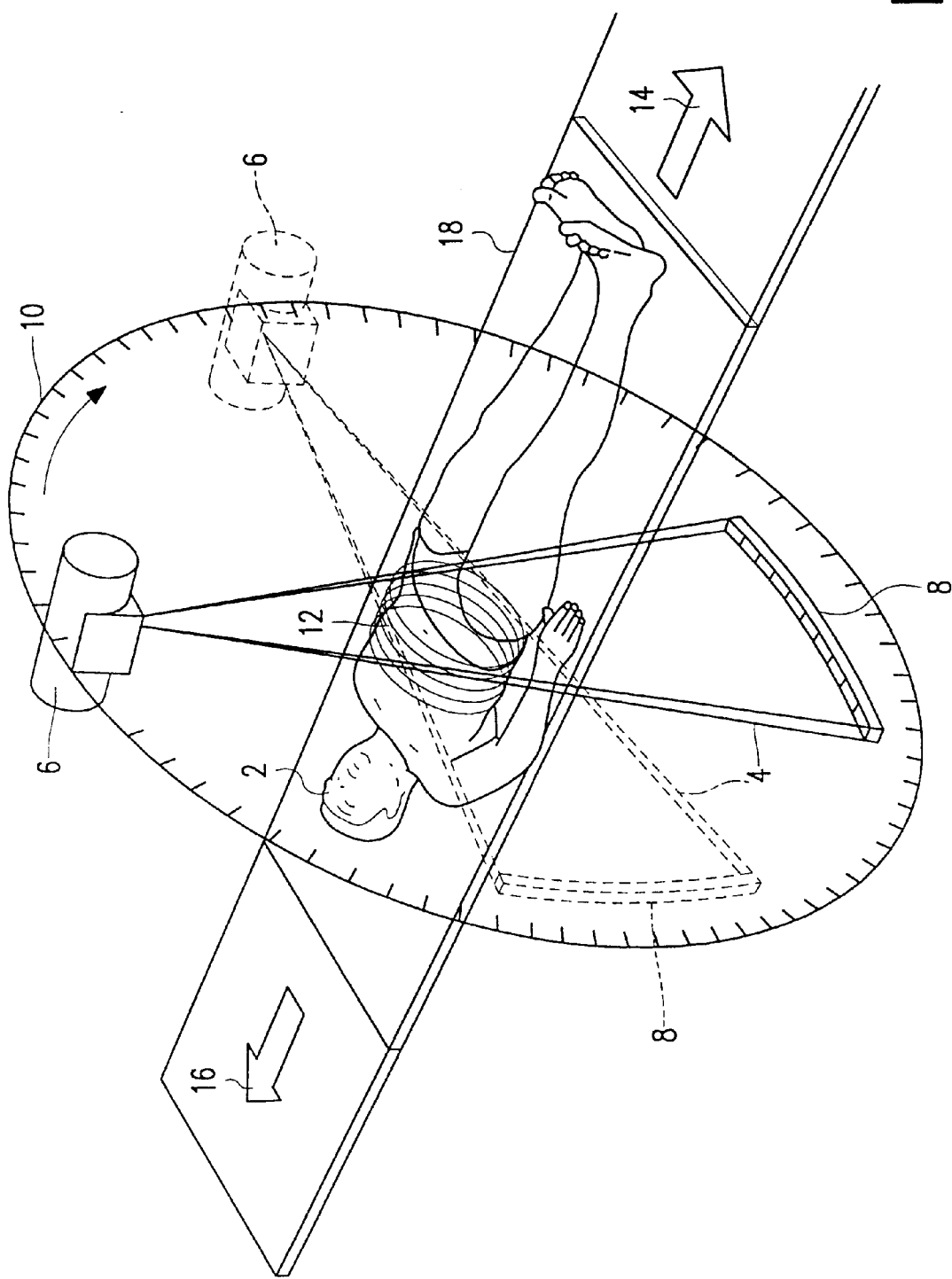
FIG. 1 is a perspective view of a part of an X-ray imaging apparatus which is relevant to the invention.

FIG. 1 is a perspective view of a part of an X-ray imaging apparatus which is relevant to the invention. The Figure concerns a computer tomography apparatus which is known per se and in which the patient 2 to be examined is irradiated by a fan-shaped X-ray beam 4. This beam is generated by means of an X-ray tube 6 and is detected by an array 8 of image detector elements, which array is shaped as a segment of circle. The X-ray tube 6 and the detector array 8 rotate around the patient along a circular path 10 without changing their relative position. The system formed by the X-ray tube, the detector array and the X-ray beam is shown twice, the system having been rotated in one position relative to the other position. This system is stationary during exposure so as to obtain a tomographic image. After each exposure the system proceeds to a new position which has been slightly rotated with respect to the preceding position. After completion of the entire circle 10, enough information has been obtained so as to reconstruct an image of the irradiated slice 12 of the body of the patient. If a plurality of slices is to be imaged, the table 18 with the patient is displaced in the direction of the arrow 14 or 16 relative to the system formed by the X-ray tube and the detector array, after which the circle 10 is completed again so as to form a next image.

This known tomographic imaging method utilizes an array 8 of image detector elements in the form of a one-dimensional row of detector elements. Such an array (see FIG. 3a) consists of, for example 1000 detector elements 24; these elements are arranged with a pitch 20 of 1.5 mm and have a height 22 amounting to 20 mm. In the present numerical example the array thus has a length of 1.5 m (1000×1.5 mm). When the distance between the X-ray tube 6 and the detector array 8 is 1.2 m, the circumference of the circle 10 thus amounts to 3.77 m; for the above numerical example this circle is then subdivided into approximately 2500 pixels having a width of 1.5 mm. The new position occupied by the system after each exposure has in this case been rotated through the pitch of a detector element with respect to the preceding position. All individual elements are read in parallel so that in the case of a read time amounting to 3 ms the reading of a full circle requires 7.5 s (2500×3 ms). When a large object is imaged, images must be made of a number of slices having a width of 1.5 mm, followed by reconstruction by means of a computer.

Figure 2:
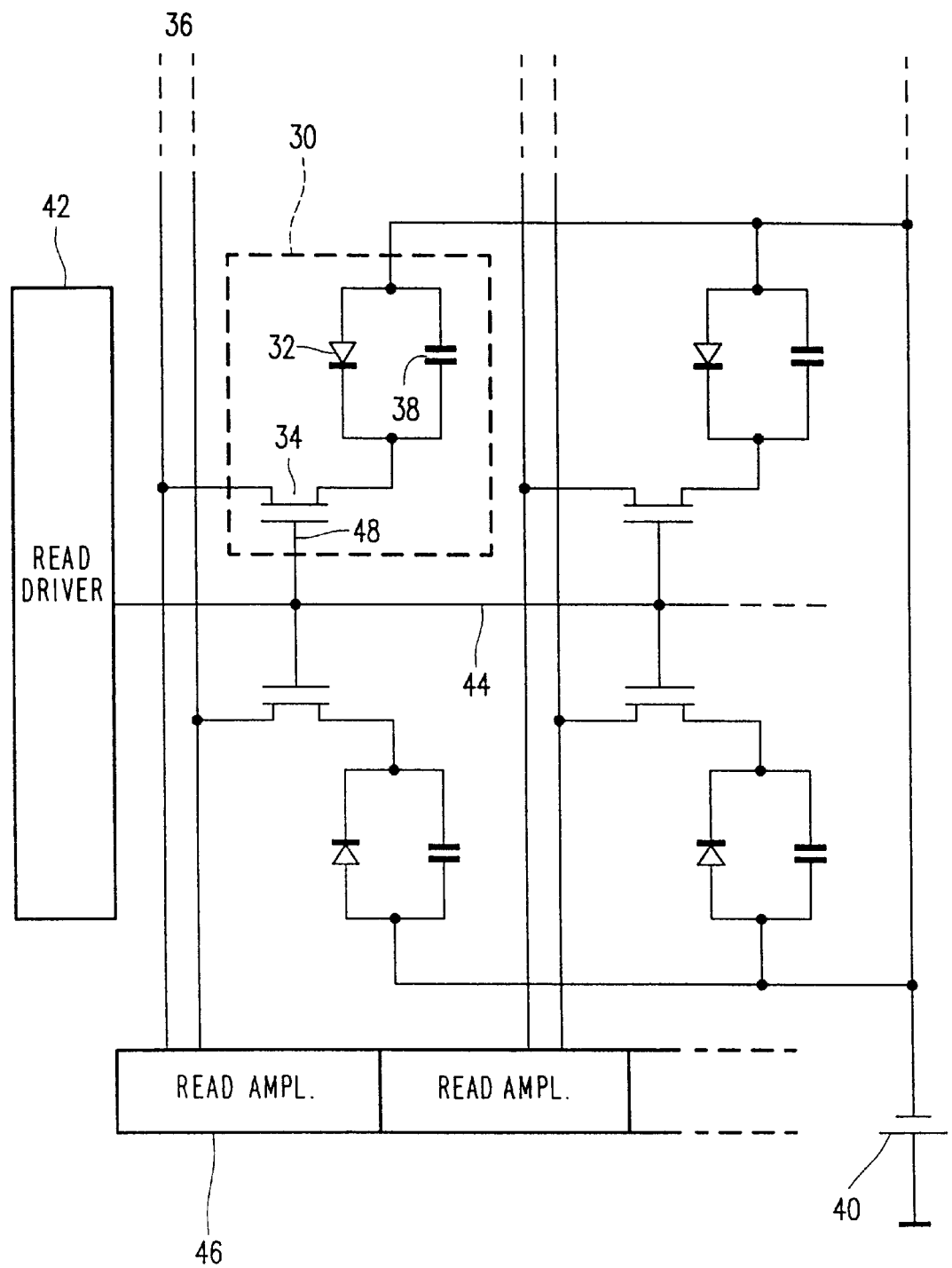
FIG. 2 shows diagrammatically a part of a radiation detector unit with some image detector elements according to the invention.

FIG. 2 shows diagrammatically a part of a radiation detector unit with some image detector elements according to the invention. For the sake of clarity this Figure shows four image detector elements 30 only, even though a practical embodiment of a two-dimensional detector array comprises a much larger number (for example, 32×16 elements per chip). The detector elements 30 are constructed on a common dielectric substrate (for example, glass) while using a thin-film technique. Each detector element 30 includes a controllable switching element 34 (for example, in the form of a thin-film field effect transistor) which is capable of connecting an associated column conductor 36 to an image sensor element in the form of a parallel connection of a photodiode 32 and a capacitance 38. The detector elements 30 are fed by a common supply source 40. There is also provided a read driver 42 which serves to control the reading of the charge of the detector elements 30. The output of the read driver 42 is connected to an associated control conductor 44 which is also connected to a respective control electrode 48 of a transistor 34 of a row of image detector elements 30. Also provided are a number of read amplifiers 46 whose number is equal to the number of columns of detector elements 30 multiplied by the number of column conductors per column, so equal to the total number of column conductors 36.

Upon exposure of the sensor element 32, 38, the capacitance 38 is charged with an electric charge which is a measure of the radiation dose incident on the relevant sensor element. When the detector elements 30 are read, the transistor 48 is turned on by the read driver 42 so that the charge of the capacitance 38 is transferred to the column conductor (read conductor) 36. The entire array can be read by successively turning on different rows of detector elements. Because a plurality of column conductors are provided per column, a plurality of detector elements can be simultaneously read in one column. Because the control conductor 44 is connected to transistors of two neighboring rows, the reading of the two rows is driven simultaneously by one control conductor 44. Two image detector elements which are not associated with the same column conductor (for example, the element denoted by the reference numeral 30 in the Figure and the element situated directly therebelow) can then be read simultaneously, because otherwise the charge of two detector elements would be applied simultaneously to one read amplifier.

Figure 3A:
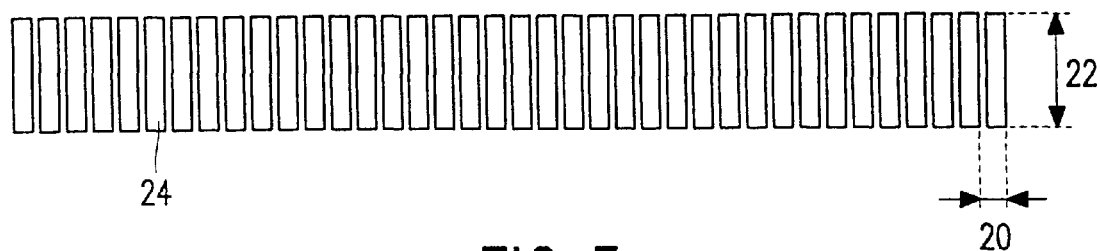
FIG. 3a shows diagrammatically a conventional segment of circle array of image detector elements.
Figure 3B:
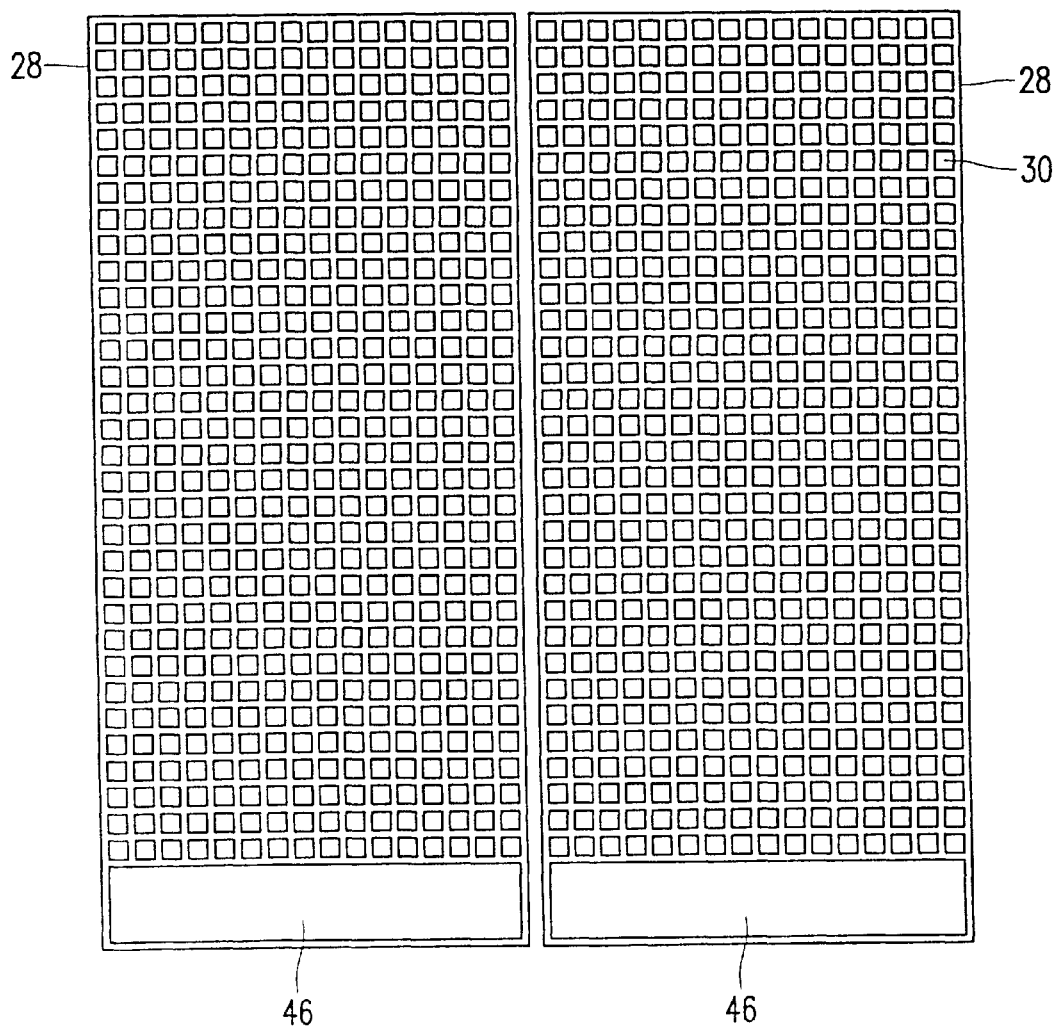

FIG. 3a shows diagrammatically a one-dimensional array of image detector elements which is to be bent so as to form a conventional segment of circle. These detector elements 24 have an elongate shape, a width which is slightly smaller than their pitch 20 of 1.5 mm, and a height 22 of 20 mm. FIG. 3b shows diagrammatically a two-dimensional array of image detector elements according to the invention which is intended as a substitute for the segment of circle of FIG. 3a. The array shown in FIG. 3b consists of an assembly of chips 28, each of which is dimensioned 48×24 mm$^2$ and consists of 32×16 detector elements 30 as described with reference to FIG. 2. The pitch of these detector elements is, for example 1.5 mm. On the lower side of each chip 28 of detector elements there is mounted a number of read amplifiers 46, being 64 amplifiers in the present example. This means that in the case of 16 columns of detector elements four column conductors are used per column. Driving of the reading of the detector elements is provided by read drivers 42 (not shown in FIG. 3b) which may be arranged adjacent the matrix surface on the chip 28 or be provided separately, if desirable.

In this novel, two-dimensional embodiment of the detector array the irradiating X-ray beam is no longer fan-shaped, as in the case of a one-dimensional array, but is shaped as a cone. When the matrix of detector elements is read in 3 ms by means of only one read conductor, the read time per row may in this case be 94 $\mu$s ($\frac{3}{32}$ ms). In an embodiment involving four read conductors per column and one control conductor for each time two rows, this time may amount to 375 $\mu$s. Such a long read time may be useful for two reasons. First of all, because of their size the capacitance of the photodiodes is comparatively high (order of magnitude of 200 pF); this results in an RC time of 70 $\mu$s in the case of a turned-on transistor with a resistance of 0.35 M$\Omega$. Complete reading of the detector element (5 RC-times) is thus possible within 300 $\mu$s. Secondly, the electronic noise of the read amplifiers is dependent on the read time. Low-noise reading, therefore, requires a sufficiently long read time so that a long read time may also be advantageous in this respect.

The matrix of detector elements consists of chips, each of which includes 64 read channels which read the data from the 16 columns. The 32 rows are read by means of 16 control conductors only, so that the space required for these conductors and the read drivers driving them is minimized by the invention.

All references cited herein, as well as the priority document European Patent Application 97200018.6 filed Jan. 6, 1997, are incorporated herein by reference in their entirety and for all purposes to the same extent as if each individual publication or patent or patent application was specifically and individually indicated to be incorporated by reference in its entirety for all purposes.

What is claimed is:

1. An apparatus for forming an image by means of radiation, including a radiation detector unit for output of the image, the radiation detector unit comprising:

image detector elements which are arranged in a matrix of rows and columns and each of which includes an image sensor element, being sensitive to the imaging radiation, and a controllable switching element connected thereto, each column being subdivided into a plurality of groups of image detector elements, a plurality of column-read conductors, wherein a column-read conductor is provided in each column for each group of image detectors, and wherein each column-read conductor is connectable, via the associated controllable switching elements, to image detector elements of one group of image detector elements associated with the relevant column, and transfers the output of connectable detector elements to read amplifiers for output, read drivers for driving the switching elements so as to read an electric variable from the image detector elements by connecting them to the column-read conductors, and row-control conductors, wherein at least one row-control conductor is provided for each read driver and connects the output of the connected read driver to the respective control electrodes of the controllable switching elements associated with at least two rows, wherein each read driver is connected to at least two rows of image detector elements which are not associated with the same column-read conductor, the number of rows thus connected to one read driver being at the most equal to the number of groups of image detector elements in one column.

2. An apparatus as claimed in claim 1 wherein the read drivers are connected to at least two rows of image detector elements by connecting only one row-control conductor to each read driver, said row-control conductor being connected to said at least two rows of image detector elements.

3. An apparatus as claimed in claim 2 wherein two rows of image detector elements are connected to one read driver.

4. An apparatus as claimed in claim 3 wherein four groups of image detector elements are in one column.

5. An apparatus as claimed in claim 1 wherein two rows of image detector elements are connected to one read driver.

6. An apparatus as claimed in claim 5 wherein four groups of image detector elements are in one column.

* * * * *